US009217556B2

(12) United States Patent
Suzuki

(10) Patent No.: US 9,217,556 B2
(45) Date of Patent: Dec. 22, 2015

(54) METHOD OF MANUFACTURING LIGHT EMITTING DEVICE, AND LIGHT EMITTING DEVICE

(71) Applicant: NICHIA CORPORATION, Anan-shi, Tokushima (JP)

(72) Inventor: Ryo Suzuki, Anan (JP)

(73) Assignee: NICHIA CORPORATION, Anan-shi (JP)

(*) Notice: Subject to any disclaimer, the term of this patent is extended or adjusted under 35 U.S.C. 154(b) by 324 days.

(21) Appl. No.: 13/726,483

(22) Filed: Dec. 24, 2012

(65) Prior Publication Data

US 2013/0163244 A1    Jun. 27, 2013

(30) Foreign Application Priority Data

Dec. 26, 2011 (JP) .................................. 2011-283757
Nov. 5, 2012 (JP) .................................. 2012-243533

(51) Int. Cl.
*H01J 1/62* (2006.01)
*H01J 63/04* (2006.01)
(Continued)

(52) U.S. Cl.
CPC . *F21V 21/00* (2013.01); *F21V 7/00* (2013.01); *F21V 9/16* (2013.01); *H01L 33/0079* (2013.01); *H01L 2933/0066* (2013.01); *Y10T 29/49117* (2015.01)

(58) Field of Classification Search
CPC ......... H01L 24/80; H01L 33/36; H01L 33/56; H01L 24/17; H01L 24/97; H01L 33/52; H01L 33/60; H01L 33/08; H01L 24/06; H01L 25/0753; H01L 27/156

USPC .......... 313/498–512; 362/240, 232, 236, 372, 362/311.02, 241, 247, 800, 249.02
See application file for complete search history.

(56) References Cited

U.S. PATENT DOCUMENTS 7,488,089 B2 *  2/2009  Park et al. ..................... 362/237
7,621,654 B2 * 11/2009  Nishimoto et al. ........... 362/241
(Continued)

FOREIGN PATENT DOCUMENTS

CA        1112749 A1    11/1981
EP        2197045 A1     6/2010
(Continued)

OTHER PUBLICATIONS

Extended European Search Report of the corresponding European Application No. 12199265.5, dated Apr. 4, 2013.

*Primary Examiner* — Thomas A Hollweg
*Assistant Examiner* — Kevin Quarterman
(74) *Attorney, Agent, or Firm* — Global IP Counselors, LLP

(57) ABSTRACT

A method of manufacturing a light emitting device includes: disposing a group of electrically conductive members on a support substrate, the group of the electrically conductive members forming a plurality of mounting portions arranged in two or more columns and two or more rows with the mounting portions respectively corresponding to a plurality of light emitting elements; placing the light emitting elements on the group of the electrically conductive members with a bonding member being disposed between the light emitting elements and the electrically conductive members, each of the light emitting elements being shifted from a corresponding one of the mounting portions; and melting the bonding member to mount the light emitting elements respectively on the mounting portions by self-alignment effect generated by the melting of the bonding member.

11 Claims, 7 Drawing Sheets

(51) Int. Cl.
*F21V 21/00* (2006.01)
*F21V 9/16* (2006.01)
*F21V 7/00* (2006.01)
*H01L 33/00* (2010.01)

(56) References Cited

U.S. PATENT DOCUMENTS 8,129,734 B2 * 3/2012 Mazzochette .................. 257/98
8,188,488 B2 * 5/2012 Andrews et al. ............... 257/81
8,440,500 B2 * 5/2013 Su et al. ......................... 438/99
8,614,109 B2 * 12/2013 Suzuki ........................... 438/26
2002/0112348 A1 8/2002 Inoue et al.
2003/0189829 A1 * 10/2003 Shimizu et al. ............... 362/240
2011/0266579 A1 * 11/2011 Nagai ............................. 257/98
2012/0112622 A1 * 5/2012 Suzuki et al. .................. 313/326

FOREIGN PATENT DOCUMENTS

JP 2002-134892 A 5/2002
WO 2011-007621 A1 1/2011

* cited by examiner

METHOD OF MANUFACTURING LIGHT EMITTING DEVICE, AND LIGHT EMITTING DEVICE

BACKGROUND OF THE INVENTION

1. Field of the Invention

The present invention relates to a method of manufacturing a light emitting device and a light emitting device.

2. Background Information

There has been used a surface mount type light emitting device, in which a light emitting element such as a light emitting diode (LED) or a laser diode (LD) is mounted on a substrate. Such light emitting devices are used for lighting apparatus, backlight of display screen, light source for vehicle, light source for display, auxiliary light source for moving images, and other general consumer light sources. As compared with conventional light sources, such light emitting devices have a longer life and are capable of emitting light under an energy-serving environment, which are attracting high expectation as a next generation light source for lighting applications.

In recent years, even higher levels of output powder is in demand, and in order to comply, increase in size (a larger planar dimension) of a light emitting element or a combination of plurality of small-size light emitting elements has been conducted. On the other hand, in order to produce an application product in which the orientation characteristic is controlled by using a lens system or the like, the light emitting device preferably has a light source as close to a configuration of a single light source as possible, that is, as close to a configuration of a point light source as possible. For this reason, in order to realize high power output, a use of a single, large-size light emitting element is preferable. However, although a technique of mounting a large planar dimension light emitting element on a package or the like is relatively easy to perform, production of such a light emitting element having a large planar dimension from a wafer with good yield is difficult.

For this reason, when a plurality of small sized light emitting elements, which are easily obtained with good production yield, is used, cost advantage can be attained. However, an arrangement of the plurality of light emitting elements close together in order to achieve a configuration close to a point light source is difficult to obtain due to the accuracy of mounting positions. For this reason, there has been proposed to print a solder with a pre-determined amount of offset or shift for each of the electronic components such as a plurality of light emitting elements to be mounted (for example, see JP 2002-134892A).

It is described that, with the use of self-alignment effect, this method allows positioning of each light emitting element at an intended position in the step of solder-bonding.

However, in practice with the method described in JP 2002-134892 A, the degree of accuracy of mounting positions may become unstable and a satisfactory level has not been achieved.

SUMMARY OF THE INVENTION

The present invention is devised to solve the problems as described above, and is aimed to provide a method of manufacturing a light emitting device which enables high accuracy mounting of a plurality of light emitting elements to achieve a configuration close to a point light source, by utilizing self-alignment effect of a bonding member generated at the time of melting.

The present invention includes the aspects described below.

(1) A method of manufacturing a light emitting device includes: disposing a group of electrically conductive members on a support substrate, the group of the electrically conductive members forming a plurality of mounting portions arranged in two or more columns and two or more rows with the mounting portions respectively corresponding to a plurality of light emitting elements; placing the light emitting elements on the group of the electrically conductive members with a bonding member being disposed between the light emitting elements and the electrically conductive members, each of the light emitting elements being shifted from a corresponding one of the mounting portions; and melting the bonding member to mount the light emitting elements respectively on the mounting portions by self-alignment effect generated by the melting of the bonding member.

(2) A light emitting device includes a support substrate and three or more light emitting elements. The support substrate has a group of electrically conductive members disposed thereon. The light emitting elements are mounted on the group of the electrically conductive members. The group of electrically conductive members form a plurality of mounting portions arranged in two or more columns and two or more rows, with the light emitting elements being respectively mounted on the mounting portions via a bonding member by self-alignment of the bonding member.

A method of manufacturing a light emitting device according to the aspects of the present invention enables high accuracy mounting of a plurality of light emitting elements to achieve a configuration close to a point light source, by utilizing self-alignment effect of a bonding member generated at the time of melting.

DETAILED DESCRIPTION OF EMBODIMENTS

Figure 1:
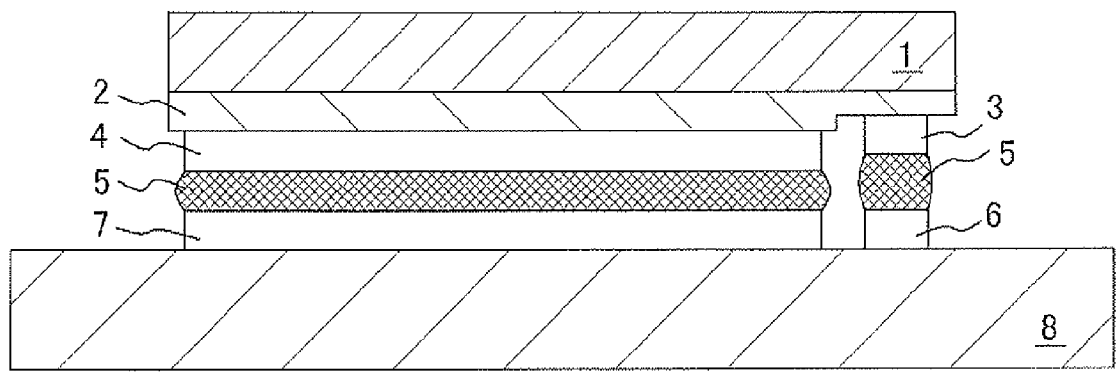
FIG. 1 is a schematic cross-sectional view showing a mounting portion of a light emitting element produced according to a method of manufacturing a light emitting device according to one embodiment of the present invention.

In the present specification, the sizes, materials, shapes and the relative positions of the members described in examples are given as an example and not as a limitation to the scope of the invention unless specifically stated. The sizes and the arrangement relationships of the members in each of drawings are occasionally shown exaggerated for ease of explanation. Members same as or similar to those of this invention are attached with the same designation and the same reference numerals, and their description is omitted.

A method of manufacturing a light emitting device according to the embodiments is carried out by mounting a plurality of light emitting elements on a group of electrically conductive members, disposed on a support substrate, through a bonding member. That is, the method is for mounting the light emitting elements which are reduced to a relatively small size in a closely spaced manner with high accuracy so as to resemble a point light source. For this, the positions of light emitting elements are moved to their respective intended positions by utilizing self-alignment effect of the bonding member during the bonding process.

(Light Emitting Element)

A light emitting element used in a method of manufacturing a light emitting device according to the embodiments has, for example as shown in FIG. 1, a semiconductor layer 2 which is made of a first conductive-type semiconductor layer, a light emitting layer, and a second conductive-type semiconductor layer and is disposed on a sapphire substrate 1, a first element electrode 3 formed on a surface of the first conductive-type semiconductor layer, and a second element electrode 4, for example, formed on the surface of the second conductive-type semiconductor layer at the same surface side as the first element electrode 3 with respect to the substrate 1 made of sapphire.

Figure 2A:
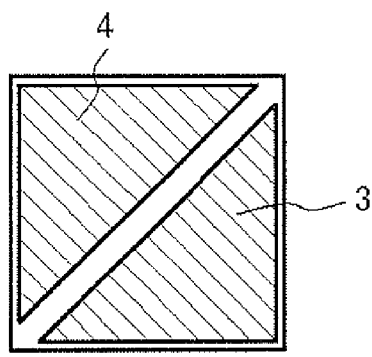
FIG. 2A is a diagram illustrating an arrangement of electrodes seen in a plan view of a light emitting element.
Figure 2B:
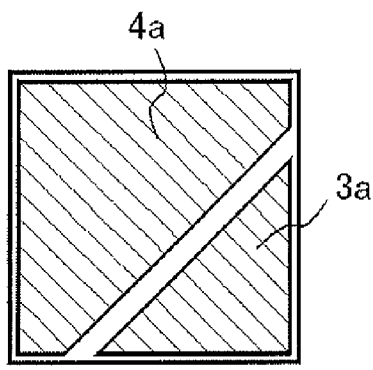
FIG. 2B is a diagram illustrating another arrangement of electrodes seen in a plan view of a light emitting element.

Of those described above, a growth substrate, such as a sapphire substrate, used for growing a semiconductor layer is not required when used in a light emitting device. Therefore, such a growth substrate may be removed before or after placing a light emitting element. For example, the sapphire may be separated (removed) by firstly mounting a light emitting element which has a nitride semiconductor layer on a sapphire substrate on a support substrate, then irradiating laser beam to produce local thermal decomposition at the interface between the sapphire and the semiconductor layer. The wavelength of the laser beam is preferably 365 nm or less and more preferably 250 nm or less. The laser beam is preferably applied for about 10 to 20 seconds. The first element electrode 3 and the second element electrode 4 are arranged, for example as shown in FIG. 2A, on the same surface side with respect to the substrate 1 of the light emitting element, in triangular shapes created by diagonally dividing a quadrangular shape into approximately halves, in a planar shape (planar view). Those electrodes do not necessarily have the same planar dimension on a single light emitting element. For example, as shown in FIG. 2B, one of the first element electrode 3a and second element electrode 4a may have a planar dimension smaller than that of the other. The planar shape of a single light emitting element is not limited and may be formed in various shapes such as a quadrangular shape, a polygonal shape, or the like. Among those, a quadrangular shape, particularly a rectangular shape is preferable. The light emitting element is mounted in a flip-chip manner on a support substrate 8 where the first substrate electrode 6 and the second substrate electrode 7 are disposed thereon as a group of electrically conductive members.

Figure 9A:
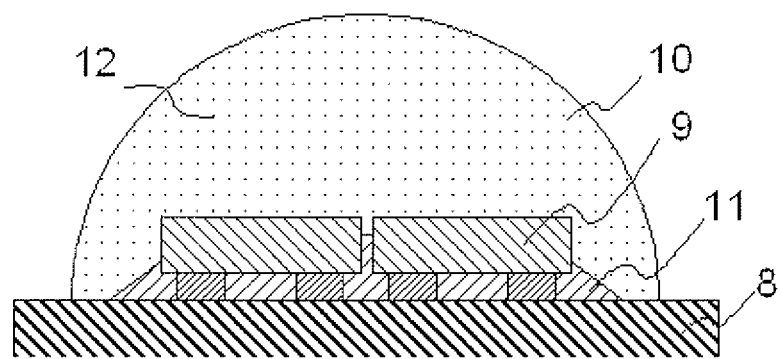
FIG. 9A is a schematic cross-sectional view of a light emitting device produced according to a method of manufacturing a light emitting device according to one embodiment of the present invention.
Figure 9B:
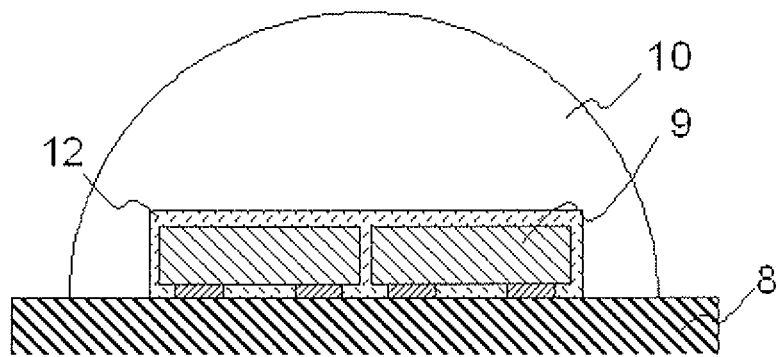
FIG. 9B is a schematic cross-sectional view of another light emitting device produced according to a method of manufacturing a light emitting device according to one embodiment of the present invention.

The light emitting elements are not limited to have the construction as described above, and a protective layer, a reflective layer, a fluorescent material layer, or the like, may be arranged appropriately. Examples of the fluorescent material layer include a layer made of a fluorescent material or a resin which contains a fluorescent material and covers the outside of the semiconductor light emitting element structure which is capable of emitting blue light. For example, combining a YAG (yttrium aluminum garnet) based fluorescent material activated with cerium and capable of emitting yellow light or a silicate-based fluorescent material such as $(Sr, Ba)_2SiO_4$:Eu with a blue light emitting element enables obtaining a white light emitting element. The emission color is not limited to white, and red, blue, green, or the like, a desired color can be obtained by selecting the emission wavelength of the light emitting element and the type of the fluorescent material. The fluorescent material layer may be disposed as a sealing member (which will be described later) containing the fluorescent material (12 in FIG. 9A), or by way of electrodeposition of the fluorescent material (12 in FIG. 9B) or by attaching the fluorescent material as a sheet.

(Supporting Substrate)

The support substrate used in the method of manufacturing a light emitting device according to the embodiments is a so-called mounting substrate, package substrate, or the like and the material thereof is not specifically limited, and is preferably formed of an insulating material such as plastic, ceramic, or glass. Also, the surface of the supporting substrate is at least provided with a group of electrically conductive members for supplying power to each electrode of the light emitting elements.

The term "a group" used in the specification refers to a configuration in which, as described above, in the case where a plurality of light emitting elements are arranged close together to resemble a point light source, a plurality of electrically conductive members respectively corresponding to the positive and negative electrodes of each light emitting element are arranged close together to supply electricity to all of the plurality of light emitting elements which to resemble a single point light source.

Figure 3A:
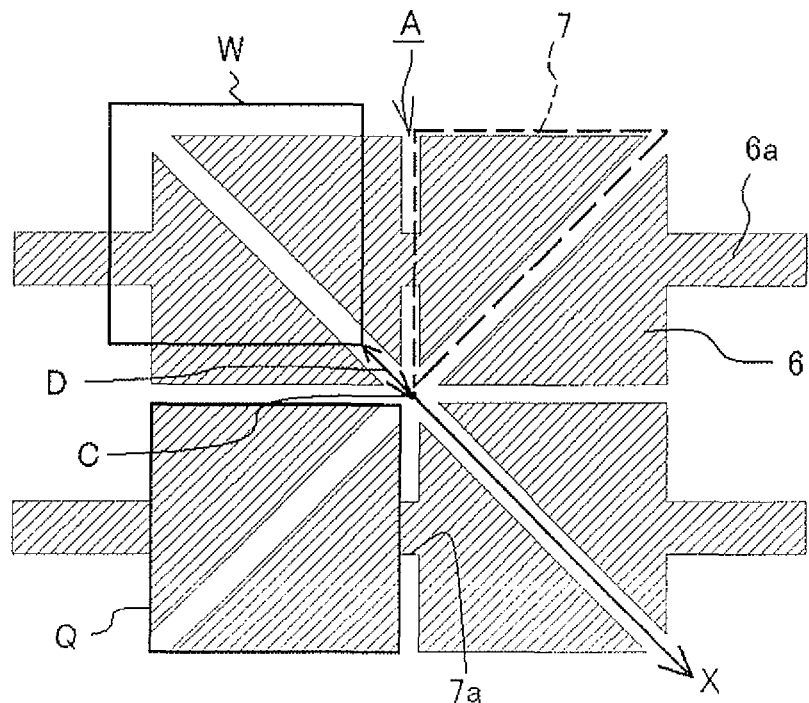
FIG. 3A is a plan view showing an arrangement of electrically conductive members for illustrating an embodiment of a method of manufacturing a light emitting device according to the present invention.
Figure 5A:
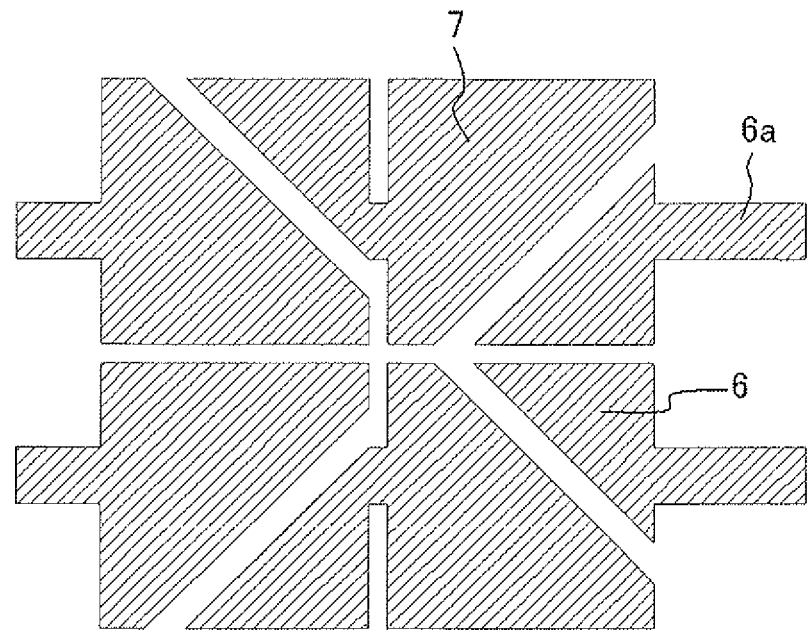
FIG. 5A is a plan view showing an arrangement of electrically conductive members for illustrating another embodiment of a method of manufacturing a light emitting device according to the present invention.
Figure 6A:
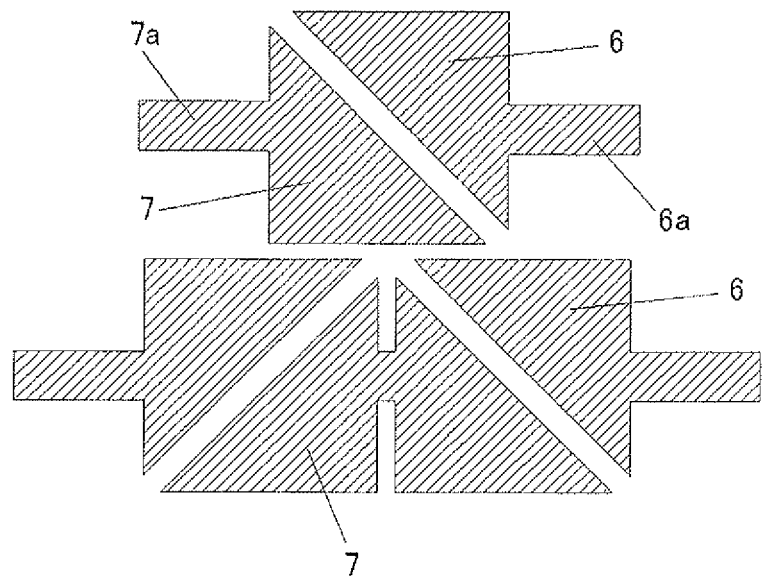
FIG. 6A is a plan view showing an arrangement of electrically conductive members for illustrating further another embodiment of a method of manufacturing a light emitting device according to the present invention.

The group of electrically conductive members have a plurality of mounting portions configures to respectively mount a single light emitting element, and the mounting portions are to electrically connect with the respective electrodes of each light emitting elements through alignment. The mounting portions are arranged in a two-dimensional configuration. In other words, the mounting portions are arranged in two or more columns and two or more rows. In such arrangement, two or more mounting portions in column direction and two or more mounting portions in row direction are needed. For example, four mounting portions arranged in two columns and two rows as shown in FIG. 3A, and nine or more mounting portions arranged in three or more columns and three or more rows may be exemplified. Also, as shown in FIG. 6A, the arrangement may include one mounting portion in one column or one mounting portion in one row, as long as two columns and two rows are included. In other words, the arrangement of the mounting portions is preferably not linear as in an arrangement where three or more light emitting elements are linearly arranged. Although not shown, in the case where the mounting portions are arranged in a random manner, each of the mounting portions is assumed to form a single column and/or row and an arrangement may be made of one or more columns and a plurality of rows, or of a plurality of columns and one or more rows (preferably two or more columns and a plurality of rows or a plurality of columns and two or more rows). In other words, the term "a group of electrically conductive members" refers to a configuration, for example as respectively shown in FIG. 3A, 4A, and FIG. 5A, a total of six pieces of electrically conductive members (corresponds to four mounting portions) respectively correspond to the positive and negative electrodes of each light emitting element are arranged close together and totally separately or partly divided, in order to arrange four light emitting elements to resemble a single point light source. As shown in FIG. 6A, in order to arrange three light emitting elements for resembling a single point light source, exemplified is an arrangement of five pieces of electrically conductive members (correspond to three mounting portions) which are disposed close together and totally separately or partly divided corresponding to the positive and negative electrodes of each light emitting element. Such a group of electrically conductive members include a plurality of electrically conductive members which respectively correspond to positive and negative electrodes on a single support substrate and one pair of positive and negative electrodes constitute one mounting portion.

The number of light emitting elements to resemble a single point light source is not limited to 4, and may be about 3 to 16, preferably about 4 to 9. Accordingly, the pieces of corresponding group of electrically conductive members is not limited to 6 pieces and for example, may be about 3 to 20 pieces, preferably 6 to 12 pieces are used.

In the specification, the expression "portions totally separated or partially divided corresponding to one positive or negative electrode of each light emitting element" substantively refers to a mounting portion, and excludes a portion arranged for supplying electric power or for electrically connecting to an external driving circuit, that is, excludes an extended portion which will be described later. Thus, the term "totally separated portion" refers, for example in FIG. 3A, to the electrically conductive members 6, and the term "partially divided portion" refers to the electrically conductive member 7 which has a partial division shown by an arrow A in the figure.

The group of electrically conductive members may have a portion for electrically connecting the mounting portions or an extended portion extended from the mounting portion onto the support substrate for providing a portion for establishing another electric connection. The extended portions respectively preferably extend in directions different from radial directions from the approximate center of the group of electrically conductive members (for example, an extended portion 6*a* in FIG. 5A), and in the case where the extended portions are used for feeding portions, a width capable of sufficiently supplying electricity to the mounting portion is needed. With this arrangement, a failure in self-alignment due to the extended portion can be kept to a minimum.

Each of the electrically conductive members configured to form a group of electrically conductive members, that is a mounting portion, and disposed totally separated or partially divided corresponding to the positive and negative electrodes of each of the light emitting elements preferably has the planar dimension the same or up to about 10% smaller compared to the planar dimension of a first element electrode 3 or a second element electrode 4 of the light emitting element. With this arrangement, self-alignment effect generated by the melting of the bonding member can be efficiently utilized.

Specifically, the support substrate is formed such that, for example, stacking sheets of alumina ceramics to form a support substrate, and stacking a metal sheet or the like on the support substrate and processing the metal sheet into a predetermined wiring pattern to form the electrically conductive members. The material of the electrically conductive members is not specifically limited and any materials used in the art can be used, as long as, as described above, it is capable of allowing light emitting elements to be placed thereon and establishing electric connections to respective electrodes of the light emitting elements and capable of establishing electrical connections to an external driving circuit.

According to a method of manufacturing a light emitting device according to the embodiments, a plurality of the above described light emitting elements are placed via a bonding member on a group of electrically conductive members (that is, a mounting portion) with the light emitting devices are respectively shifted from the corresponding mounting portions in radial directions with respect to the approximate center of the group of electrically conductive member. In the specification, the expression "shifted in radial directions" means that, the light emitting elements are placed on the group of electrically conductive members respectively at positions offset from their corresponding mounting portions along respective hypothetical lines extending in radial directions from approximately center of the group of electrically conductive members. For this, the bonding member is disposed beforehand on the group of electrically conductive members (particularly on the mounting portion) on the support substrate. The bonding member can be disposed by using a thin-film deposition technique (such as sputtering, plating, or vapor deposition) or a paste deposition technique, for example, a technique described in JP 2002-134892 A. In this case, it is preferable that the material, position, amount (thickness if used as a thin film) of the bonding member, and the interval between the adjacent bonding members are appropriately adjusted. For example, when using a thin-film deposition technique, the thickness of the bonding member is preferably 10 µm or greater before and after the melting. Also, in the case of using a paste deposition technique, the thickness of the bonding member is preferably 10 µm or greater, more preferably 20 µm or greater, before and after the melting. In any case, the thickness is adjusted so as not to reach the active layer of the light emitting element. The size (planar dimension) of the bonding member is preferably similar to, or slightly larger or slightly smaller than the planar dimension of the light emitting element. Particularly, in the case where a flip-chip mounting is employed, a larger size tends to results in shortcircuit due to a short distance from the support substrate to the active layer, so that the bonding member is preferably formed with a similar or slightly smaller planar dimension compared to the planar dimension of the light emitting element.

The bonding member preferably contains at least one selected from the group consisting of Au, Ag, Cu, Sn, Bi, and Pb. For the bonding member, for example, an electrically conductive paste such as a solder which contains a eutectic alloy (Sn—Ag—Cu, Au—Sn, and the like), or a thin film made of such a paste can be used. In order to facilitate melting, an activator to reduce an oxidized film on the surface of the bonding material and facilitate melting is preferably added to the bonding member described above.

In the specification, the term "approximately the center of a group of electrically conductive members" means an approximate center (or a point corresponding to the center of gravity) with respect to the outer contour of the group of electrically conductive members which are respectively connected to the plurality of light emitting elements to resemble a single point light source as described above. In other words, it means an approximate center or the center of gravity with respect to the entire external contour of the "mounting portion" of the group of electrically conductive members. In the specification, the term "approximately" is intended to allow a variation of about ±5% in the diameter or a side of the entire mounting portion, or intended to allow a variation of about ±10 µm. The amount of shift of the light emitting elements in a radial direction is preferably controlled to about 30% or less with respect to the length in the radial direction of respective light emitting elements (in other words, the diagonal length of each light emitting element). With this arrangement, a failure in self-alignment can be prevented and high density mounting can be performed easily and with a good production yield.

In the specification, the term shifting the light emitting elements "from their corresponding mounting portions along respective hypothetical lines extending in radial directions from an approximately center of the group of electrically conductive members" means that, in the case where four quadrangular light emitting elements are mounted, for example, placing the light emitting elements respectively to a location shifted from approximately the center of the corresponding group of electrically conductive members in a diagonal direction with respect to the intended position of each of the light emitting elements. Accordingly, in the case where four light emitting elements are mounted, the shifting directions along hypothetical lines extending in radial directions may be (360/4) degrees apart from each other, and in the case where three light emitting elements are mounted, the shifting directions may be (360/3) degrees apart from each other.

Figure 3B:
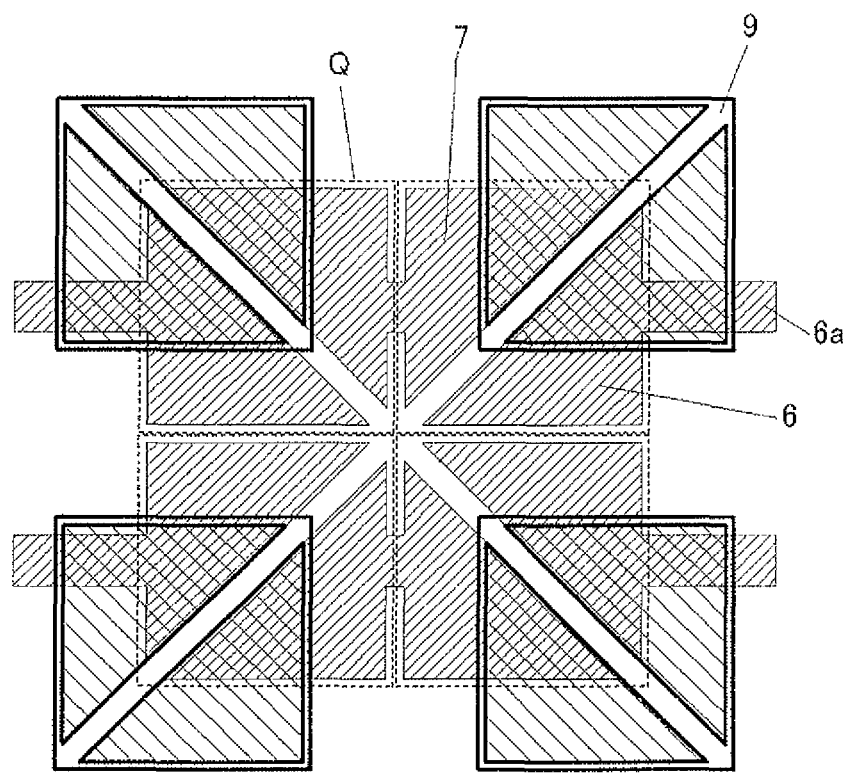
FIG. 3B is a plan view showing shifted positions of light emitting elements with respect to the electrically conductive members, for illustrating an embodiment of a method of manufacturing a light emitting device according to the present invention.

Depending on the number of the light emitting elements to be placed, the directions to shift the light emitting elements do not need to be uniform. That is, as long as the self-alignment effect generated by the melting of the bonding member can be achieved to gather the plurality of light emitting elements, the light emitting elements may be shifted not only in a radial direction along a hypothetical line which is a direction from approximately the center of the electrically conductive members to the intended position (position corresponding to the mounting portion) of each light emitting element, but also in a longitudinal direction, a lateral direction, or an oblique direction. Further, the shifting direction does not necessarily originate from approximately the center of the group of electrically conductive members and may originate from approximately the center of a part of the group of electrically conductive members. Also, depending on the number of the light emitting elements to be mounted, a part or all of the light emitting elements may be shifted in a radial direction. For example, in the cases where four light emitting elements are used as shown in FIG. 3B or three light emitting elements are used as shown in FIG. 5A, all of the light emitting elements are preferably shifted in a radial direction.

After the light emitting elements are placed on an electrically conductive member with the light emitting elements being shifted from their intended positions, the bonding member is melted. The melting condition can be adjusted appropriately according to the bonding member to be used, and for example, melting may be performed at a temperature range of about 230 to 280° C. for about 1 to 10 minutes. In view of mass productivity, uniformity in heating, and stability in the melting atmosphere, the heating is preferably applied to securely conduct a so-called reflow-technique (surface mounting technology). The self-alignment effect of the bonding member can be achieved by melting the bonding member, which enables mounting with a distance between adjacent light emitting elements of less than 20 µm. The self-alignment effect can be appropriately adjusted also by the type, amount, position, and/or duration of melting of the bonding member, the configuration of the light emitting elements, or the like. Particularly, the allowable range of the shilling can be controlled by the use of a eutectic alloy (such as Sn—Ag—Cu and Au—Sn), adjustment of the supply, increasing the rate of temperature rise, or the like so as to achieve more efficient self-alignment effect.

After the light emitting elements are mounted on the support substrate, the light emitting elements and/or the support substrate may be covered with a protective film. For example, at least covering the electrically conductive members on the support substrate with a white protective film such as $TiO_2$ or $Al_2O_3$ facilitates reflect light from the light emitting elements, so that absorption of light by the electrically conductive members can be prevented. The protective film can be disposed by using various techniques, and examples thereof include electrodeposition.

The light emitting elements are mounted on the support substrate and then at an appropriate stage, sealing is applied by a unit corresponding to the group of electrically conductive members, using a light transmissive sealing member which will be described later. With this, a light emitting device capable of providing a light surface with three or more light emitting elements closely disposed each other can be manufactured.

A light emitting device according to the embodiments includes three or more light emitting elements mounted on mounting portions on a group of electrically conductive members arranged on a support substrate. As described above, the group of electrically conductive members has a plurality of mounting portions, each capable of mounting a single light emitting element, arranged in two or more columns and two or more rows. The light emitting elements are mounted on respective mounting portions provided on a group of electrically conductive members by using self-alignment through a bonding member, along respective hypothetical lines extending in radial directions from an approximate center of the group of electrically conductive members. it is preferable that all the light emitting elements are arranged on their respective hypothetical lines at designated positions corresponding to their respective mounting portions, but it is allowable that one or more of the all light emitting elements are placed on their respective hypothetical lines with a slight shift toward the approximate center of the group of electrically conductive members, and in some cases, it is also allowable that one or more of the light emitting elements are placed on their respective hypothetical lines with a slight shift away from the approximate center of the group of electrically conductive members. The light emitting elements placed on their respective hypothetical lines at positions different from their designated positions can be mounted at the correct positions by self-aligning by using the techniques as described above, for example, the action of self-aligning takes place by self-alignment effect achieved by melting the bonding member, and the traces of the self-aligning can be observed by microscopic observation of the surfaces of the electrically conductive members.

(Sealing Member)

The light emitting device according to the embodiments preferably has, instead of, or in addition to the covering by the protective film as described above, a sealing member (10 in FIGS. 9A and 9B) on the support substrate, to cover and also to protect the light emitting elements and the like from dust, moisture, external force or the like. The material for constituting the sealing member may have optical tranmissivity and optical resistance that allows the light from the light emitting element to transmit through while being fairly resistant to deterioration by the light. As a specific example of the material, a resin having optical transmissivity capable of passing the light from the light emitting element, such as a silicone resin, a modified silicone resin, a modified epoxy resin, a fluororesin, or a combination of those, is preferable. Particularly, a hybrid resin with one or more resins having a siloxane skeleton such as a dimethyl silicone resin, a phenyl silicone resin having a low content of phenyl groups, and a fluorinated-silicone resin is more preferably used. The sealing member preferably has a JIS-A hardness of 10 or more and/or a JIS-D hardness of 90 or less, more preferably has a JIS-A hardness of 40 or more and/or a JIS-D hardness of 70 or less, and further preferably has a JIS-A hardness of 40 or more and a JIS-D hardness of 70 or less. In addition to these materials, a coloring agent, a light diffusing agent, a light reflecting material, various fillers, a wavelength converting material (a fluorescent material) or the like may also be appropriately contained in the sealing member. The shape of the sealing member can be set according to the light distribution characteristics or the like, and for example, the directionality can be adjusted by forming the upper surface in a shape such as a convex lens, a concave lens, or Fresnel lens. Particularly, a plurality of light emitting elements are mounted closely to each other to serve as a point light source, so that forming the sealing member in a convex lens shape allows extraction of light having high directionality. The sealing member can be disposed by using potting (dripping) technique, compression molding technique, printing technique, transfer molding technique, jet-dispensing technique, or the like.

(Underfill)

Also, in the light emitting device according to the embodiments, an underfill (11 in FIG. 9A) is preferably disposed under the light emitting elements (between the light emitting elements and corresponding support substrates). The sealing member described above is difficult to reach (be filled) under the light emitting elements. Therefore, in the case where a plurality of light emitting elements are mounted close to each other, disposing an underfill before disposing the sealing member allows prevention of occurrence of voids or the like at portions under the light emitting elements. The underfill may be formed by using a resin containing a resin described below as a base polymer, the examples of the resin include a silicone resin, a modified silicone resin, an epoxy resin, a modified epoxy resin, an acrylic resin, a urea resin, a fluororesin, or a combination of those, or a hybrid resin containing one or more of those resins. Of those, a resin containing a silicone resin and/or an epoxy resin as its base polymer is preferable, which is further preferably contains a resin similar to the sealing member. In the specification, the term "a base polymer" means a resin having a highest content of the materials constituting the underfill. The underfill preferably contains, for example, a reflective material and/or diffusion material such as $SiO_2$, $TiO_2$, $Al_2O_3$, $ZrO_2$, and $MgO$. With this arrangement, light can be reflected sufficiently.

The following description will describe a method of manufacturing a light emitting device with reference to the drawings. The embodiment described below is intended to exemplify the technical spirit of the present invention, and the scope of the invention is not limited to those described below.

Embodiment 1

In order to mount a light emitting element on a support substrate 8 having a group of electrically conductive members disposed on its surface as shown in FIG. 1, firstly, a light emitting element and a support substrate 8 are prepared. The light emitting element has a size of, for example in a plan view, about 1.0 mm×1.0 mm. The first electrode 3 and the second electrode 4 of the light emitting element have, as shown in FIG. 2A. approximately the same planar dimension. For the support substrate 8, an alumina ceramic substrate is used. The support substrate 8 is cut in a final process to obtain individual light emitting devices with a size of approximately 3.0 mm×3.0 mm. Hereinafter, a single light emitting device will be described, but in a practical sense, a plurality of light emitting devices are processed simultaneously before dividing into individual devices. On the surface of the support substrate 8, a group of electrically conductive members made up of six pieces of electrically conductive members as shown in FIG. 3A is disposed. The electrically conductive members respectively correspond to the first element electrode 3 and the second element electrode 4 which respectively correspond to the positive and negative electrodes of the light emitting element, and function as the first substrate electrode 6 and the second substrate electrode 7 respectively. The first substrate electrode 6 and the second substrate electrode 7 are mainly constitute the mounting portion of the electrically conductive member and further have extended portions 6a extended in a lateral direction from those mounting portions, and extended portions 7a for connecting between, for example, the second substrate electrodes 7. A single unit of mounting portion made of a first substrate electrode 6 and a second substrate electrode 7, in other words, a mounting portion connected to both electrodes of a single light emitting element is formed with substantially the same size as that of the light emitting element.

On the groups of electrically conductive members as described above, an electrically conductive paste made of Sn—Ag—Cu is disposed respectively as a bonding member 5 as shown in FIG. 1. The electrically conductive paste is disposed on the mounting portions at the positions corresponding to approximately the centers of respective electrodes of each of the light emitting elements, which are the positions after the alignment, by, for example, a paste deposition technique. The melting temperature of the bonding member 5 is about 250° C.

Four light emitting elements are placed on the electrically conductive members through the bonding member (at positions W in FIG. 3A) with the light emitting elements being shifted from respective intended positions Q. The amount of shift is set to correspond to a distance D (for example 100 to 200 μm) from the intended mounting positions of the light emitting elements, which is from approximately the center of the outer contour of the group of electrically conductive members (the point C in FIG. 3A) to each of four radial directions (one of the directions is shown by the arrow X in FIG. 3A). That is, in the case of arranging four quadrangular light emitting elements in columns and rows (2×2), four light emitting elements 9 are placed (see FIG. 3B) respectively with the light emitting elements 9 being shifted from the common center of the four light emitting element which corresponds to approximately the center of the group of electrically conductive members, in a direction along a diagonal line of quadrangular light emitting element which corresponds to a radial direction from approximately the center of the group of electrically conductive members.

Thereafter, melting the bonding member by way of reflow or using a hot plate and maintaining the melted state for 1 to 10 seconds, then allowing to cool to room temperature to achieve the self-alignment effect due to the surface tension of the fused bonding member, to align the light emitting elements 9 which are placed with the shift (placed at positions W respectively) into respective intended mounting positions (that is, intended position Q respectively). With this, the element electrodes of each light emitting element and respective substrate electrodes of the support substrate are mechanically and electrically connected. The four light emitting elements connected with each other as described above are respectively moved toward approximately the center of the outer contour of the group of electrically conductive members and mounted, with a distance between the light emitting elements of less than about 20 μm. The light distribution of the emitted light exhibits the characteristics closely resembling a point light source.

Embodiment 2

Figure 4:
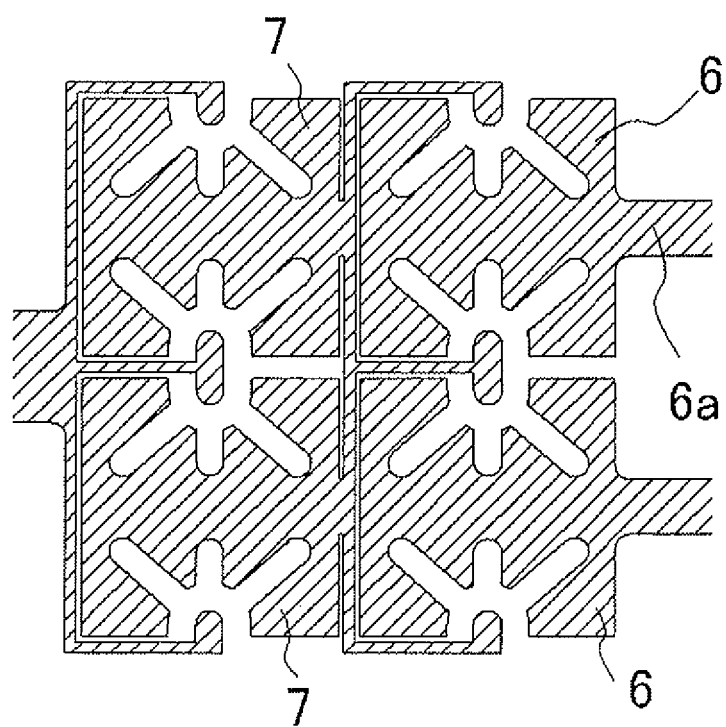
FIG. 4 is a plan view showing an arrangement of electrically conductive members for illustrating another embodiment of a method of manufacturing a light emitting device according to the present invention.

The light emitting device was fabricated in the same manner as in Embodiment 1 except that the pattern of the group of electrically conductive members had a shape as shown in FIG. 4. As a result, in the same manner as in Embodiment 1, a distance of less than 20 μm between the light emitting elements was achieved.

Embodiment 3

Figure 5B:
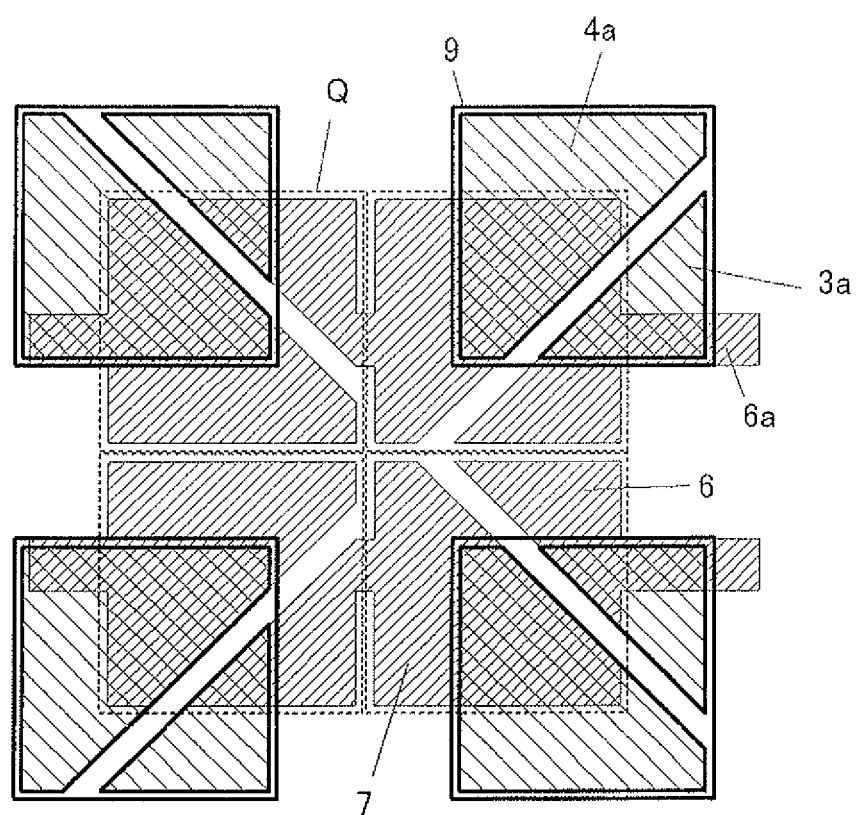
FIG. 5B is a plan view showing shifted positions of light emitting elements with respect to the electrically conductive members, for illustrating an embodiment of a method of manufacturing a light emitting device according to the present invention.

The light emitting device is fabricated in the same manner as in Embodiment 1 except for using the light emitting elements having the shapes of the first element electrode 3a and the second element electrode 4a as shown in FIG. 2B and employing a pattern of the group of electrically conductive members as shown in FIG. 5A, and placing the light emitting elements 9 with the light emitting elements 9 being shifted with respect to the intended positions Q as shown in FIG. 5B. As a result, in the same manner as in Embodiment 1, a distance of less than 20 μm between the light emitting elements can be achieved. Further, occurrence of short circuit between the electrodes can be prevented.

Embodiment 4

Figure 6B:
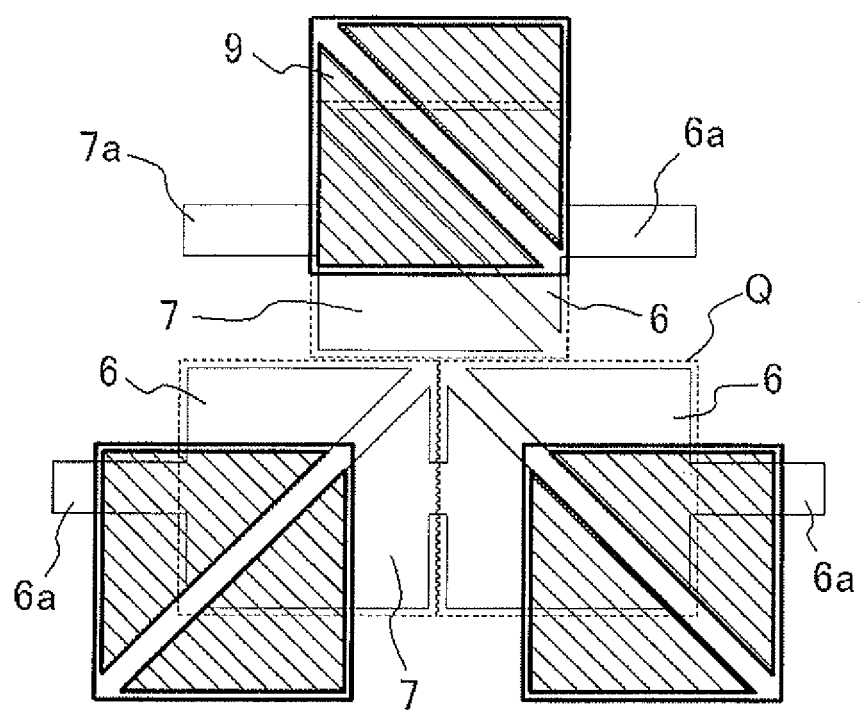
FIG. 6B is a plan view showing shifted positions of light emitting elements with respect to the electrically conductive members, for illustrating yet another embodiment of a method of manufacturing a light emitting device according to the present invention.

The light emitting device is fabricated in the same manner as in Embodiment 1, except that the pattern of the group of electrically conductive members has a shape as shown in FIG. 6A and the light emitting elements 9 are placed with the light emitting elements 9 being shifted with respect to the intended positions Q as shown in FIG. 6B. As a result, in the same manner as in Embodiment 1, a distance of less than 20 μm between the light emitting elements can be achieved.

Embodiment 5

Figure 7:
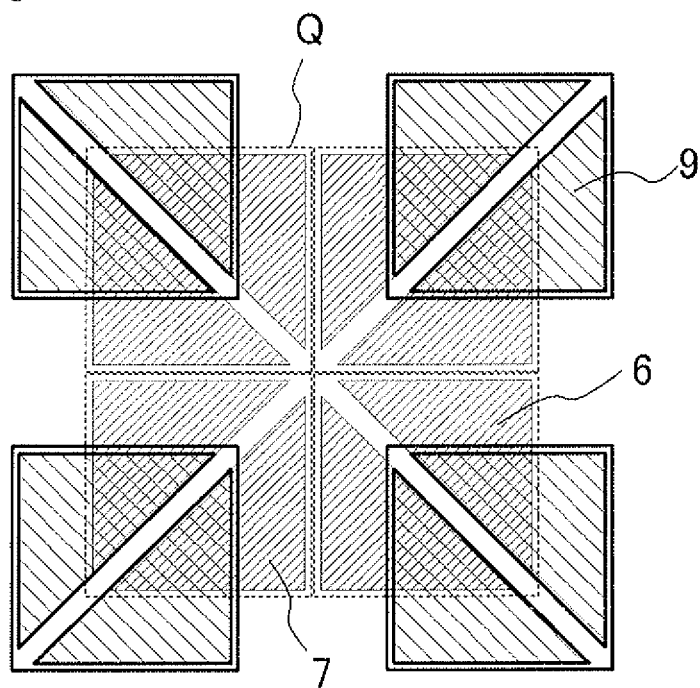
FIG. 7 is a plan view showing shifted positions of light emitting elements with respect to the electrically conductive members, for illustrating yet another embodiment of a method of manufacturing a light emitting device according to the present invention.

The light emitting device is fabricated in the same manner as in Embodiment 1 except that the pattern of the group of electrically conductive members has a shape as shown in FIG. 7. As a result, in the same manner as in Embodiment 1, a distance of less than 20 μm between the light emitting elements can be achieved.

Embodiment 6

Figure 8:
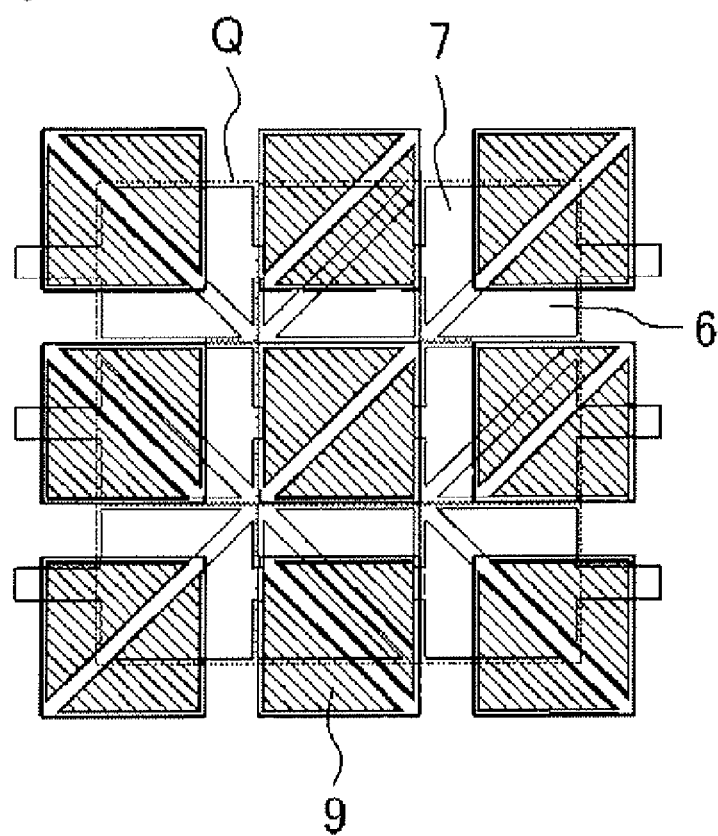
FIG. 8 is a plan view showing shifted positions of light emitting elements with respect to the electrically conductive members, for illustrating yet another embodiment of a method of manufacturing a light emitting device according to the present invention.

The light emitting device is fabricated in the same manner as in Embodiment 1 except that the pattern of the group of electrically conductive members has a shape as shown in FIG. 8 and nine light emitting elements are mounted. The light emitting element at a center of the nine light emitting elements is arranged substantially not to be shifted with respect to its mounting portion.

As described above, according to the method of manufacturing a light emitting device as described in the embodiments above, the self-alignment effect generated at the time of melting the bonding member can be maximally facilitated, and mounting of the light emitting elements at very close positions can be achieved easily and with high accuracy. This enables realization of a collective mounting to closely resemble a point light source, and which enables easy manufacturing of a light emitting device having a plurality of light emitting elements configured to function as a pseudo point light source. As a result, it becomes possible to easily control the light distribution characteristics of the light emitting device.

The method of manufacturing a light emitting device according to the present invention can be suitably employed for various lighting apparatuses, in particular, a light source for lighting, an LED display, backlight source for a liquid crystal display device, signals, a lighted switch, various sensors, various indicators, an auxiliary light source for moving image, other consumer light sources, or the like.

What is claimed is:
1. A light emitting device comprising:
 a support substrate having a group of electrically conductive members disposed thereon; and
 three or more light emitting elements mounted on the group of the electrically conductive members,
 the group of electrically conductive members forming a plurality of mounting portions arranged in two or more columns and two or more rows, with each of the light emitting elements being respectively mounted on a corresponding one of the mounting portions via a bonding member so that the light emitting elements are disposed adjacent to each other after the light emitting elements are shifted toward each other both in a column direction and in a row direction by self-alignment of the bonding member, the electrically conductive members being arranged into a plurality of electrode pairs respectively corresponding to the mounting portions, with each of the electrode pairs including a positive electrode and a negative electrode, and a planar dimension of the positive electrode and the negative electrode in each of the electrode pairs being the same or smaller than a planar dimension of a corresponding one of the light emitting elements.

2. The light emitting device according to claim 1, wherein each of the light emitting elements is respectively mounted on the corresponding one of the mounting portions along a corresponding one of hypothetical lines extending in radial directions from an approximate center of the group of the electrically conductive members.

3. The light emitting device according to claim 1, wherein the group of the electrically conductive members further forms a plurality of extended portions with each of the extended portions connecting adjacent ones of the mounting portions or extended from one of the mounting portions.

4. The light emitting device according to claim 1, wherein each of the electrode pairs corresponding to each of the mounting portions has the planar dimension equal to or up to 10% smaller than the planar dimension of an electrode part of the corresponding one of the light emitting elements.

5. The light emitting device according to claim 1, wherein each of the light emitting elements has a fluorescent material layer.

6. The light emitting device according to claim 1, wherein the light emitting elements are sealed with a light transmissive sealing member.

7. The light emitting device according to claim 6, wherein the sealing member contains a fluorescent material.

8. The light emitting device according to claim 1, wherein an underfill is disposed between the light emitting elements and the support substrate.

9. The light emitting device according to claim 8, wherein the underfill contains a reflective material.

10. The light emitting device according to claim 1, wherein a distance between adjacent ones of the light emitting elements is less than 20 μm.

11. The light emitting device according to claim 1, wherein surfaces of the electrically conductive members include traces caused by shifting of the light emitting elements by the self-alignment of the bonding member.

* * * * *